United States Patent [19]
Fung et al.

[11] Patent Number: 5,650,731
[45] Date of Patent: Jul. 22, 1997

[54] PHOTOVOLTAIC OXIDE CHARGE MEASUREMENT PROBE TECHNIQUE

[75] Inventors: Min-Su Fung, Lagrangeville; Roger Leonard Verkuil, Wappinger Falls; Bob Hong Yun, Hopewell Junction, all of N.Y.

[73] Assignee: International Business Machines Corporation, Armonk, N.Y.

[21] Appl. No.: 764,776

[22] Filed: Dec. 12, 1996

Related U.S. Application Data

[63] Continuation of Ser. No. 440,503, May 12, 1995, abandoned.

[51] Int. Cl.$^6$ .................................................. G01R 31/02
[52] U.S. Cl. ............................................ 324/752; 324/765
[58] Field of Search .................................. 324/751, 752, 324/750, 719, 662, 761, 765, 73.1, 158.1, 71.3; 250/310, 311, 492; 356/400, 401; 257/48; 437/8

[56] References Cited

U.S. PATENT DOCUMENTS

| | | | |
|---|---|---|---|
| 4,464,627 | 8/1984 | Munakata et al. | 324/159 R |
| 4,544,887 | 10/1985 | Kamieniecki | 324/158 R |
| 4,563,642 | 1/1986 | Munakata et al. | 324/752 |
| 4,827,212 | 5/1989 | Kamieniecki | 324/158 R |
| 4,859,939 | 8/1989 | Gittleman et al. | 324/752 |
| 4,891,584 | 1/1990 | Kamieniecki et al. | 324/158 R |
| 4,956,603 | 9/1990 | Russo | 324/158 D |
| 5,017,863 | 5/1991 | Mellitz | 324/71.3 |
| 5,025,145 | 6/1991 | Lagowski | 250/211 J |
| 5,087,876 | 2/1992 | Reiss et al. | 324/158 D |
| 5,091,691 | 2/1992 | Kamieniecki et al. | 324/158 R |
| 5,138,256 | 8/1992 | Murphy et al. | 324/71.3 |
| 5,493,236 | 2/1996 | Ishii et al. | 324/765 |
| 5,500,607 | 3/1996 | Verkuil | 324/761 |

OTHER PUBLICATIONS

R. L. Verkuil, "Rapid Contactless Method for Measuring Fixed Oxide Charge Associated with Silicon Processing", IBM Technical Disclosure Bulletin, V. 24, No. 6, pp. 3048–3053, Nov. 1981.

M. S. Fung, et al., "Contactless Photovoltage vs Bias Method for Determining Flat–Band Voltage" IBM Technical Disclosure Bulletin, V. 32, No. 9A, pp. 14–17, Feb. 1990.

*Primary Examiner*—Vinh P. Nguyen
*Attorney, Agent, or Firm*—Charles W. Peterson, Jr.; Graham S. Jones, II

[57] ABSTRACT

An apparatus for measuring charge in an oxide layer overlying a silicon substrate containing very high density product chips characterized by thick oxides and high substrate doping levels in the field regions. A specially designed extremely thin conductive probe is pressed against the oxide layer whose charge is to be measured. A bias is applied to the probe for biasing the underlying silicon surface into accumulation or inversion. An intensity modulated light beam is focussed at the point of probe contact. The resulting amplitude modulated photovoltage is detected and applied to a computer to derive the value of the oxide charge therefrom.

19 Claims, 1 Drawing Sheet

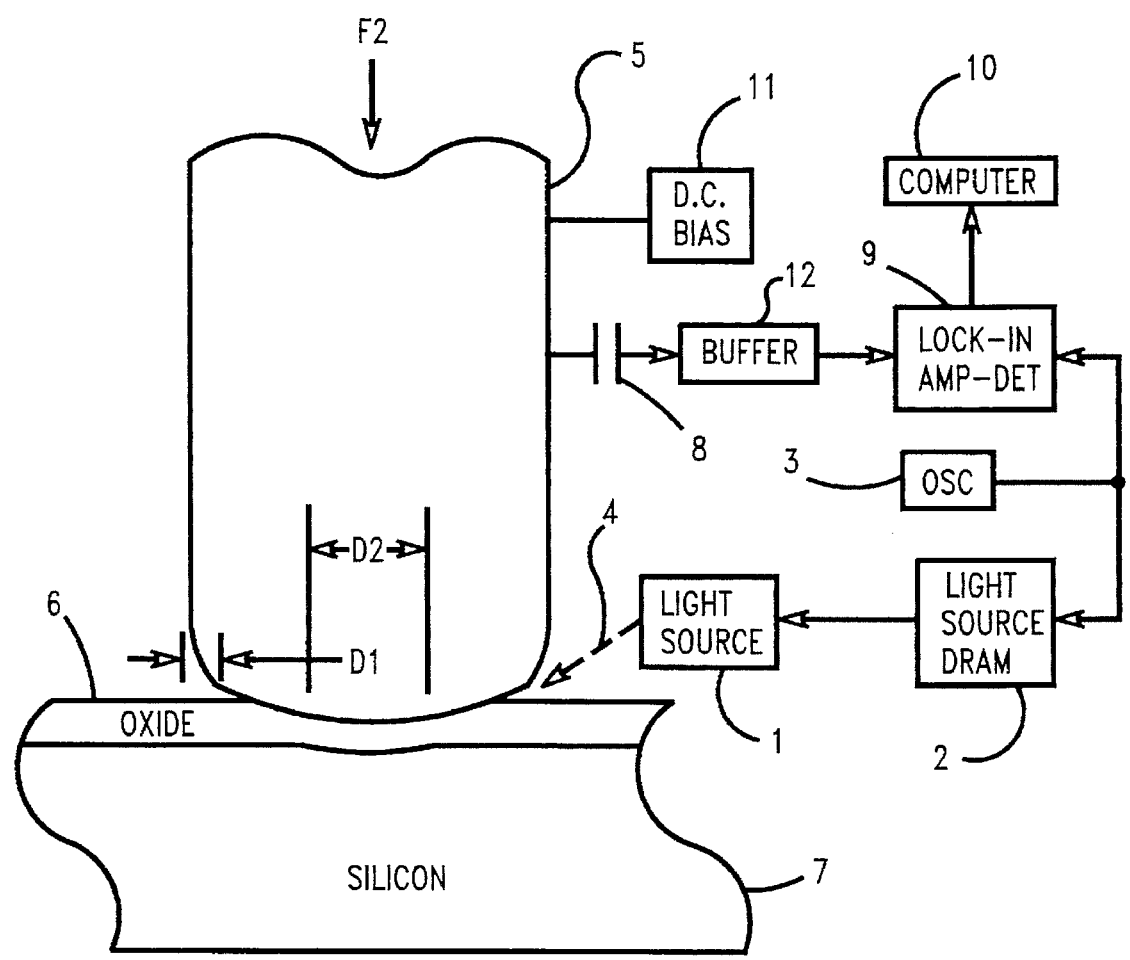

3,650,731

PHOTOVOLTAIC OXIDE CHARGE MEASUREMENT PROBE TECHNIQUE

The application is a continuation of application Ser. No. 08/440,503, filed May 12, 1995, now abandoned.

BACKGROUND OF THE INVENTION

The invention generally relates to oxide charge measurements on microelectronic device chips and, more particularly to making such measurements on VLSI product chips characterized by high device density, relatively thick oxides and relatively high substrate doping levels in the field regions.

The well-known capacitance versus bias voltage technique for measuring oxide charge is not well suited for use with present day high device density chips where permissible probe size is very limited due to access space constraints in the oxide-on-silicon regions of the chips. The limited probe area reduces the signal-to-noise ratio of the resulting data signal for deriving the desired oxide charge measurement. Moreover, this situation is exacerbated in the case of increasing oxide thickness and increasing silicon doping concentration, typical of the accessible VLSI measurement sites, whereby the maximum and minimum capacitance of a C-V trace tend towards equalling each other. Thus, the problem becomes one of trying to amplify the difference between two capacitances that are noisy and approximately of the same magnitude. The result is then a signal which is too weak and too noisy to be useful.

It is also known to employ a photovoltaic effect for making contactless measurements at the surface of semiconductor devices utilizing a variable bias voltage on a capacitive pick-up. A transparent electrode (for allowing light to pass through) and an insulator or air gap between the electrode and the underlying semiconductor is usually employed. Such pick-up probes require that relatively extensive illumination and surrounding capacitive pick-up areas be available on the devices undergoing measurements. U.S. Pat. No. 5,087,876 issued to Leszek Reiss, et al. on Feb. 11, 1992, U.S. Pat. No. 5,025,145 issued to Jacek J. Lagowski on Jun. 18, 1991, U.S. Pat. No. 4,827,212 issued to Emil Kamieniecki on May 2, 1989, U.S. Pat. No. 4,464,627 issued to Chusuke Munakata, et al. on Aug. 7, 1984, IBM® Technical Disclosure Bulletin article entitled "Contactless Photovoltage vs Bias Method for Determining Flat-Band Voltage", by M. S. Fung, et al. Vol. 32, No. 9A, February, 1990, p. 14 and IBM Technical Disclosure Bulletin article entitled "Rapid Contactless Method for Measuring Fixed Oxide Charge Associated With Silicon Processing" by R. L. Verkuil, Vol. 24, No. 6, November, 1981, all are examples of the aforedescribed photovoltaic effect technology.

U.S. Pat. No. 4,956,603 issued to Vincenzo Russo on Sep. 11, 1990 discloses a method for measuring the lifetime of a PN semiconductor junction which includes subjecting one side of the junction to light of a known intensity and measuring the voltage generated by the photovoltaic effect at the ends of the junction. The method is not suitable for oxide charge measurement in LSI wafers.

SUMMARY OF THE INVENTION

One object of the present invention is to provide a technique for measuring oxide charge on a less than 25 micron-sized MOS structure with thick oxide and heavily doped silicon structure.

Another object is to provide a technique for the in-line measurement of oxide charge in VLSI semiconductor production chips.

These and other objects of the present invention are achieved in a best mode embodiment by the use of specially designed contacting probe and a photovoltaic effect technique for providing a strong signal having good signal-to-noise ratio representing oxide charge. Whereas MOS capacitance does not vary enough when the silicon surface is biased from accumulation to inversion, as in the foregoing discussion of the capacitance versus bias voltage technique, the photovoltaic effect allows the measurement of a different electrical property of the MOS system that exhibits a much greater change from accumulation to inversion of the silicon surface.

Briefly, an extremely thin, opaque conductive probe is brought to bear against the oxide layer whose charge is to measured. A bias is applied to the probe for biasing the underlying silicon surface into accumulation or inversion. An intensity modulated light beam is focused at the point of probe contact from a side position. The area within the transparent probes of the prior art to permit the transmission of sufficient light therethrough is eliminated, allowing for a much narrower probe contact. The resulting amplitude modulated photovoltage is capacitively coupled from the probe to a synchronized detector driven by the same signal which intensity modulates the light. The detected signal is applied to a computer to derive the value of the oxide charge therefrom.

BRIEF DESCRIPTION OF THE DRAWING

The sole figure is a simplified composite view comprising the probe and silicon device components in cross-section and the remainder of the components of the best mode embodiment in block diagram format.

BEST MODE FOR CARRYING OUT THE INVENTION

The photovoltaic effect or surface photo voltage effect occurs when light, sufficiently energetic for electron-hole pair generation, impinges on a silicon surface. If there is an electric field in the surface of the silicon, due to the silicon surface being depleted or inverted, then the light induced electron hole pairs become separated by the silicon surface field and they thereby establish their own field in the opposite direction which tends to cancel the original silicon surface field. As the net silicon surface field diminishes, there is a corresponding change in the silicon surface potential which change is known as the photovoltage.

To facilitate the detection of the photo voltage, the intensity of the light source 1 of the sole figure is modulated in sinusoidal fashion by light source driver 2. Driver 2, in turn receives its sinusoidal control signal from oscillator 3. The light beam 4 from source 1 is focussed at the point of contact between probe 5 and oxide layer 6 overlying silicon substrate 7. Light beam 4 is directed along a path emanating from a side position as shown to minimize the shadowing effect of opaque, conductive probe 5 at the point of contact. No provision is made within probe 5 to conduct light axially therethrough in order to permit the smallest diameter possible for the probe.

The sinusoidal photovoltage resulting from the intensity modulated light beam impinging upon the point of contact to oxide layer 6 and penetrating therethrough to the underlying silicon substrate is coupled via capacitor 8 through buffer 12 to lock-in amplifier-detector 9. Detector 9 receives sinusoidal reference signal from oscillator 3 for the synchronous detection of the sinusoidal photovoltage. The amplitude of the detected photovoltage is applied to oxide charge computer 10. D.C. bias source 11 provides a voltage via probe 5 for biasing the underlying silicon surface into accumulation or inversion.

For a given light intensity, a photovoltage signal varies by 10 to 100 times when a silicon surface is driven from accumulation to inversion despite relatively thick overlying oxides and relatively high silicon doping concentration. For example, for an oxide thickness of 1000 Angstroms and a silicon doping concentration of 5E17 atoms/cm$^3$, the accumulation-to-inversion MOS capacitance signal only changes by 10 percent. This is in contrast to the corresponding photovoltage change by a factor of 100 exploited by the present invention. The concomitant signal-to-noise advantage allows for a significant reduction in probe tip area while still obtaining useful data for oxide charge measurements. There are two major reasons for reducing the probe tip area: (1) Small area oxide charge measurements are most suitable for monitoring and diagnosing charge problems directly on product wafers where very little open area is available for such measurements, and (2) a small area electrode can be implemented by using the tip of a solid, opaque needle or wire having certain mechanical properties now to be described.

A preferred probe for use with the present invention is described in copending patent application Ser. No. 08/173,320 filed Dec. 22, 1993, U.S. Pat. No. 5,500,607, in the name of the present inventor for "Probe Oxide-Semiconductor Method and Apparatus for Measuring Oxide Charges on a Semiconductor Wafer" and assigned to the present assignees. It teaches a specially designed probe and a capacitance versus bias voltage technique using said probe for measuring oxide charge. The same probe also is particularly well suited in the photovoltage environment of the present invention involving thick oxides and high doping concentrations. The present invention requires the use of small area probes inasmuch as a large area probe would block too much of the light beam needed for generating photovoltaic signals. In one instance of the present invention, a light emitting diode (LED) was focussed at the approximately 15 micron diameter tip of a tungsten needle biasing the underlying silicon surface into accumulation or inversion.

Briefly, as taught in the aforesaid copending application Ser. No. 08/173,320, an electrically conductive probe needle is provided, the needle having a rounded tip of a first radius of curvature in the region D1 and a second radius of curvature in the region D2, the second radius being larger than the first. The needle, such as probe 5, is positioned above oxide layer 6 on silicon substrate 7 and the needle tip is forced down in a controlled manner by a needle mount (not shown) onto the surface of layer 6. The oxide layer 6 and the surface region of the substrate 7 undergo an elastic deformation as shown in order to obtain an intimate area contact to yield a sound electrical connection.

As can be seen from a reading of the preceding specification, the present invention is directed at the solution of and/or understanding of charge problems in bipolar or CMOS product wafers. Often, when a charge problem occurs on a product wafer, the same charge source may also affect the field regions of the product wafer. When this situation occurs, open areas of the field region can be accessed with a very narrow probe to examine the charge problem for informative gradients within a chip as well as across a wafer from the center to the edge thereof, for example. Field regions, however, tend to have thick oxides and, in some cases rather high doping concentrations. This is precisely the case where the previously described boost in the signal-to-noise ratio of the data-bearing signal afforded by the present invention, proves very advantageous.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. Apparatus for measuring charge in an oxide layer overlying a silicon substrate, said apparatus comprising:

a solid, opaque, conductive probe pressed into contact with said oxide layer said probe having a tip, focussed light beam means for illuminating the point of contact of said probe to said oxide layer from a direction to the side of said probe to minimize the effect of shadowing by said opaque probe, modulating means coupled to said light beam means for intensity modulating said light to produce a modulated photovoltage within said substrate, synchronized detector means coupled to said probe and to said modulating means for detecting said photovoltage, and computing means coupled to receive said detected photovoltage to derive the value of said charge therefrom.

2. Apparatus as defined in claim 1 wherein said tip is characterized by an inner contacting region having a first radius of curvature and an outer non-contacting region having a second radius of curvature, said first radius being greater than said second radius.

3. Apparatus as defined in claim 1 and further including direct current biasing means coupled to said probe for biasing said substrate into accumulation.

4. Apparatus as defined in claim 1 and further including direct current biasing means coupled to said probe for biasing said substrate surface into inversion.

5. Apparatus as defined in claim 1 wherein said modulating means intensity modulates said light in a sinusoidal fashion.

6. Apparatus as defined in claim 1 wherein said probe is a tungsten needle.

7. Apparatus as defined in claim 6 wherein the tip diameter of said needle is of the order of 15 microns.

8. Apparatus as defined in claim 1 wherein said oxide layer is about 1000 Angstroms thick.

9. Apparatus as defined in claim 1 wherein said substrate has a doping concentration of about 5E17 atoms/cm3.

10. Apparatus for measuring charge in an oxide layer overlying a silicon substrate said apparatus comprising:

a solid, opaque, conductive probe pressed into contact with said oxide layer, said probe being composed of a material selected from the group consisting of a wire and a needle, said probe having a tip with a tip diameter of said needle of the order of 15 microns, focussed light beam means for illuminating the point of contact of said probe to said oxide layer from a direction to the side of said probe to minimize the effect of shadowing by said opaque probe, modulating means coupled to said light beam means for intensity modulating said light to produce a modulated photovoltage within said substrate, synchronized detector means coupled to said probe and to said modulating means for detecting said photovoltage, and computing means coupled to receive said detected photovoltage to derive the value of said charge therefrom.

11. Apparatus as defined in claim 10 wherein said tip is characterized by an inner contacting region having a first radius of curvature and an outer non-contacting region having a second radius of curvature, said first radius being greater than said second radius.

12. Apparatus as defined in claim 10 and further including direct current biasing means coupled to said probe for biasing said substrate into accumulation.

13. Apparatus as defined in claim 10 and further Including direct current biasing means coupled to said probe for biasing said substrate surface into inversion.

14. Apparatus as defined in claim 10 wherein said modulating means intensity modulates said light in a sinusoidal fashion.

15. Apparatus as defined in claim 10 wherein said probe is a tungsten needle.

16. Apparatus as defined in claim 15 wherein the tip diameter of said needle is of the order of 15 microns.

17. Apparatus as defined in claim 10 wherein said oxide layer is about 1000 Angstroms thick.

18. Apparatus as defined in claim 10 wherein said substrate has a doping concentration of about 5E17 atoms/cm3.

19. Apparatus for measuring charge in an oxide layer overlying a silicon substrate said apparatus comprising:

a solid, opaque, tungsten conductive probe pressed into contact with said oxide layer, said probe being composed of a tungsten needle, said needle having a tip diameter of the order of 15 microns, said tip being characterized by an inner contacting region having a first radius of curvature and an outer non-contacting region having a second radius of curvature, said first radius being greater than said second radius to minimize the effect of shadowing by said opaque probe, direct current biasing means coupled to said probe for biasing said substrate into a state selected from the group consisting of accumulation and inversion, focussed light beam means for illuminating the point of contact of said tungsten probe to said oxide layer from a direction to the side of said probe, modulating means coupled to said light beam means for intensity modulating said light to produce a modulated photovoltage within said substrate modulated in a sinusoidal fashion, synchronized detector means coupled to said probe and to said modulating means for detecting said photovoltage, and computing means coupled to receive said detected photovoltage to derive the value of said charge therefrom.

\* \* \* \* \*